United States Patent

Pascucci

(10) Patent No.: US 6,696,990 B2
(45) Date of Patent: Feb. 24, 2004

(54) BINARY ENCODING CIRCUIT

(75) Inventor: Luigi Pascucci, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/325,707

(22) Filed: Dec. 20, 2002

(65) Prior Publication Data

US 2003/0122693 A1 Jul. 3, 2003

(51) Int. Cl.[7] .................. H03M 5/00; H03M 7/12; H03M 1/36
(52) U.S. Cl. .................. 341/55; 341/84; 341/160; 375/242
(58) Field of Search .................. 341/55, 53, 84, 341/59, 102, 65, 49, 58, 160, 67; 375/242

(56) References Cited

U.S. PATENT DOCUMENTS

| | | | | |
|---|---|---|---|---|
| 3,909,719 A | * | 9/1975 | Martens | 375/242 |
| 3,952,298 A | * | 4/1976 | Winkelmann et al. | 341/53 |
| 4,486,739 A | * | 12/1984 | Franaszek et al. | 341/59 |
| 5,008,669 A | * | 4/1991 | Ishibashi et al. | 341/102 |
| 5,304,995 A | * | 4/1994 | Dachiku | 341/67 |
| 5,382,955 A | * | 1/1995 | Knierim | 341/64 |
| 5,396,239 A | * | 3/1995 | McMahon et al. | 341/58 |
| 5,973,950 A | * | 10/1999 | Shindo | 365/49 |
| 6,542,104 B1 | * | 4/2003 | Capofreddi | 341/160 |

* cited by examiner

*Primary Examiner*—Jean Jeanglaude
(74) *Attorney, Agent, or Firm*—Allen, Dyer, Doppelt, Milbrath & Gilchrist, P.A.; Lisa K. Jorgenson

(57) ABSTRACT

A binary encoding circuit is for converting at least first and second binary input signals into an output code that includes at least first and second binary output signals. The circuit may include at least one first selection circuit and at least one second selection circuit that are interconnected and comprise transistors that can be activated/deactivated, i.e. made to conduct/not conduct, according to the binary input signals. The circuit makes it possible to generate a binary code that represents the binary number of the binary input signals that are simultaneously asserted. The encoding circuit can act as a static counter, for example.

34 Claims, 3 Drawing Sheets

|         | CL-1 | CL-2 | CL-3 | CL-4 | CL-5 | CL |
|---------|------|------|------|------|------|----|
| Digit_3 | 0 0 0 | 0 0 0 0 | 0 0 | 0 | 0 0 | 0 | 0 | 0 | 0 1 |
| Digit_2 | 0 0 0 | 0 0 0 0 | 0 0 | 0 | 0 0 | 0 | 0 | 1 | 1 0 |
| Digit_1 | 0 0 0 | 0 0 1 1 | 1 1 | 1 | 1 1 | 1 | 0 | 1 | 1 0 |
| Digit_0 | 0 1 1 | 1 1 0 0 | 0 0 | 0 | 0 1 | 1 | 0 | 1 | 1 0 |
| R_7 | 0 0 0 | 0 1 0 0 | 1 0 | 1 | 1 0 | 1 | 1 | 0 1 |
| R_6 | 0 0 0 | 1 0 0 0 | 0 0 | 0 | 1 0 | 1 | 1 | 1 1 |
| R_5 | 0 0 0 | 0 0 0 0 | 0 0 | 0 | 0 0 | 1 | 1 | 1 1 |
| R_4 | 0 0 0 | 0 0 0 0 | 0 0 | 0 | 0 0 | 0 | 1 | 1 1 |
| R_3 | 0 0 0 | 0 0 0 0 | 0 0 | 0 | 0 0 | 0 | 1 | 1 1 |
| R_2 | 0 0 0 | 0 0 0 1 | 0 1 | 0 | 0 1 | 0 | 1 | 1 1 |
| R_1 | 0 0 1 | 0 0 1 0 | 0 1 | 1 | 0 1 | 0 | 1 | 1 1 |
| R_0 | 0 1 0 | 0 0 1 1 | 1 0 | 0 | 0 1 | 0 | 0 | 1 1 |

FIG. 3

BINARY ENCODING CIRCUIT

FIELD OF THE INVENTION

The present invention relates to electrical circuits, and, more particularly, to a binary encoding circuit for the conversion of a plurality of binary input signals into a binary output code and related methods.

BACKGROUND OF THE INVENTION

According to prior art, binary encoding circuits are realized by combinatorial networks that provide output signals, which constitute the output code, in accordance with the logic levels assumed by the binary signals present at the input. As a general rule, a combinatorial network is implemented from the circuit point of view by logic gates (NOT, AND, OR, etc.) and the design of the network architecture can be obtained by starting from code tables (or from Karnough maps) that express the input-output relationship of the desired encoding circuit.

However, these conventional design techniques do not make it possible to obtain combinatorial networks and, more particularly, encoding circuits that employ a reduced or minimal number of logic gates and are characterized by a simple architecture.

The reduction or minimization of the number of logic gates and the complexity of the architecture of the combinatorial encoding network is particularly critical when the network is to be realized with integrated semiconductor circuits. In this connection it should be noted, for example, that when CMOS (Complementary Metal-Oxide Semiconductor) technology is used, a single NAND logic gate is realized by two PMOS transistors and two NMOS transistors.

Furthermore, it should be noted that the conventional encoding circuits permit the assertion (or activation) of only a single input line at a time, i.e. only a single input line is asserted in each specific operating condition. For example, a decoding circuit (which has a structure that corresponds to that of an encoding circuit) employed for processing row address codes of memory cell matrices in FAMOS (Floating-gate Avalanche MOS) technology will permit the assertion of only a single output line, a word-line of the memory matrix, in each specific operating condition. According to the prior art, moreover, this limitation can be overcome only by realizing encoding circuits with priority, i.e. circuits for which not all the input signals have the same weight in the subsequent encoding process.

It has been noted that there can be applications of encoding circuits for which the possibility offered by conventional encoding circuits of either activating only a single output line in each specific operating condition, or introducing a priority ranking among the input signals, can constitute an unacceptable limitation.

SUMMARY OF THE INVENTION

In view of the foregoing background, it is therefore an object of the present invention to provide an encoding circuit that will make it possible to overcome the limitations and drawbacks associated with the prior art techniques.

This and other objects of the invention are provided by a binary encoding circuit for converting a plurality of binary input signals, including at least first and second input signals, into an output code including at least first and second binary output signals. The circuit may comprise at least two logic value supply terminals to render available a signal of a high logic level and a signal of a low logic level. The circuit may also include at least one first selection circuit comprising first and second output lines capable of being selectively connected to the logic value supply terminals based upon a logic level of the first input signal. In addition, the encoding circuit may also include at least one second selection circuit comprising third and fourth output lines capable of being selectively connected to at least one of the first and second output lines based upon a logic level of the second binary input signal. The first and second binary output signals may be provided by signals available on the third and fourth output lines.

BRIEF DESCRIPTION OF THE DRAWINGS

Further characteristics and advantages of the present invention will be brought out by the description about to be given of some preferred embodiments thereof, which are to be considered as examples and not limitative in any way, the description making reference to the attached figures, of which:

FIG. 3 is a code table used in relation with the encoding circuit of FIG. 2.

DETAILED DESCRIPTION OF THE PREFERRED EMBODIMENTS

Figure 1:
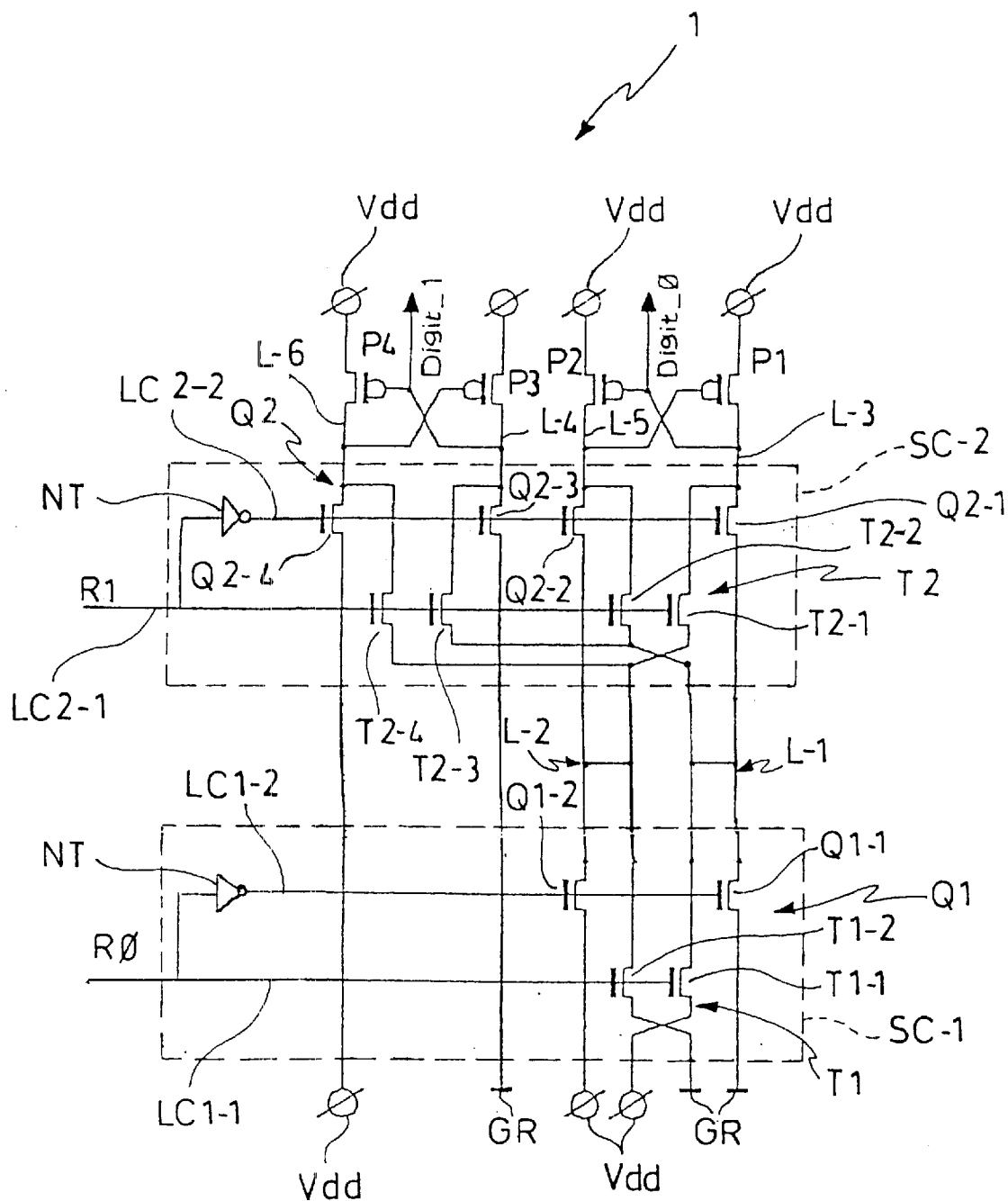
FIG. 1 is a schematic circuit diagram of a first encoding circuit realized in accordance with the invention.

FIG. 1 shows a particular example of an encoding circuit 1 in accordance with the invention. The encoding circuit makes it possible to convert a first binary input signal R0 and a second binary input signal R1 into a binary code made available by binary output signals present on a first code output line (Digit-0) and a second code output line (Digit-1).

As far as the architectural aspects are concerned, the encoding circuit 1 has a modular structure that in the particular case shown in the figure develops on two interconnected levels. The encoding circuit 1 comprises a first selection circuit SC-1 (or first-level circuit) such as to receive the first binary signal R0 as input, and a second selection circuit SC-2 (or second-level circuit) such as to receive the second binary signal R1 as an input.

Furthermore, FIG. 1 also shows the supply terminal Vdd and the ground terminal GR. The supply terminal Vdd, for example, provides a voltage signal with which there is associated a high logic level (bit 1) and the ground terminal GR provides a voltage signal with which there is associated a low logic level (bit 0). These voltage signals perform the function of reference signals from which there are obtained the output signals on the output lines Digit-0 and Digit-1.

The first selection circuit SC-1 comprises a first control or command line LC1-1 intended to carry the first binary signal R0, and a second control line LC1-2 intended to carry a complimentary signal of the signal R0 obtained by a NOT gate NT realized, for example, in CMOS technology. This first selection circuit SC-1 is provided with a first output line L-1 and a second output line L-2. In the particular example of FIG. 1, the first and the second output lines L-1 and L-2 are represented, respectively, by two short-circuited conduction lines.

Furthermore, the first selection circuit SC-1 is provided with a first group of first-level transistors, indicated overall by the reference letters T1, and a second group of first-level transistors, indicated overall by the reference letters Q1. The first group of transistors includes a first first-level transistor T1-1 and a second first-level transistor T1-2. Advantageously, these transistors T1-1 and T1-2 are MOSFET transistors and, preferably, are also N channel transistors.

The first first-level transistor T1-1 has its gate terminal connected to the first control line LC-1 and is provided with an input terminal (the drain terminal, for example) connected to the supply terminal Vdd to receive the high-level logic signal. An output terminal (the source terminal, for example) of the first first-level transistor T1-1 is connected to the first output line L-1.

The second first-level transistor T1-2 has its gate terminal connected to the first control line LC1-1 and is provided with an input terminal (the source terminal, for example) connected to the ground terminal GR to receive the low-level logic signal. An output terminal (the drain terminal, for example) of the second first-level transistor T1-2 is connected to the second output line L-2.

The first-level transistors T1-1 and T2-2 can be activated/deactivated, i.e. rendered conductive or nonconductive, on the basis of the logic level of the first binary input signal Ro applied to their gate terminals. In particular, when T1-1 and T2-2 are MOSFET transistors of the N channel type (hereinafter referred to more briefly as NMOS), they are activated (deactivated), i.e. rendered conductive (nonconductive), by a high (low)-level logic signal.

The second group of first-level transistors Q1 includes a third first-level transistor Q1-1 and a fourth first-level transistor Q1-2. These transistors Q1-1 and Q2-2 are similar to the previously described transistors and are realized, for example, by NMOS transistors.

The third (fourth) first-level transistors Q1-1 (Q1-2) have their respective gate terminals connected to the second control line LC1-2 and have their respective input terminals connected to the ground terminal GR (the supply terminal Vdd) to receive low (high) level logic signals. An output terminal of the third (fourth) first level transistors Q1-1 (Q1-2) is connected to the first (second) output line L-1 (L-2).

The first-level transistors Q1-1 and Q1-2 are activated and deactivated, i.e. rendered conductive or non conductive, on the basis of the logic level assumed by the signal present on the second control line LC-1-2.

On the basis of the logic level of the first binary signal R0, and therefore also the logic level of its compliment, the first selection circuit SC-1 makes it possible for the first (second) output line L-1 (L-2) to be selectively connected to the supply terminal Vdd and the ground terminal GR to receive the low (high) level logic signal on the first (second) output line L-1 (L-2).

It should be noted that the first selection circuit SC-1 is such that when the first and the second first-level transistors T1-1 and T1-2 are activated to conduct, the third and the fourth first-level transistors Q1-1 and Q1-2 are deactivated so as not to conduct. In particular, the first selection circuit SC-1 is such that the first output line L-1 and the second output line L-2 present output signals of inverted logic levels. Furthermore, the first selection circuit SC-1 is such that when the logic level of the first binary signal R0 is switched (from bit 1 to bit 0, and vice versa), the logic levels of the signals present on the outputs L-1 and L-2 will likewise be switched.

The second selection circuit SC-2 also comprises a third control or command line LC2-1 intended to carry the second binary signal R1 and a fourth control line LC2-2 intended to carry the negated signal of the signal R1 obtained by means of the NOT gate NT. The second selection circuit SC-2 is connected to the first output line L-1 and the second output line L-2.

Furthermore, this second selection circuit SC-2 is provided with a third output line L-3 and a fourth output line L-4 that, in the example here considered, coincide with, respectively, the first code output line Digit-0 and the second code output line Digit-1.

The output lines L-3, L-5, L-4 and L-6 of the second selection circuit SC-2 are connected, respectively, to gate terminals of transistors P2, P1, P4, P3 that are fed by the supply voltage Vdd. These transistors are preferably realized as P channel MOS transistors and this makes it possible for the circuit 1 to be supplied in such a manner as to reduce to a minimum the electrical currents in the circuit to limit the resulting power dissipation.

The second selection circuit SC-2 comprises a first group of second-level transistors, jointly indicated in FIG. 1 by the reference letters T2, and a second group of second-level transistors, jointly indicated in the figure by the reference letters Q2. The first group of second-level transistors T2 comprises a first transistor T2-1, a second transistor T2-2, a third transistor T2-3 and a fourth transistor T2-4, each preferably realized as an NMOS transistor. These second level transistors T2 of the first group have their respective gate terminals connected to the third control line LC2-1 in such a way as to assure that they will become activated/deactivated on the basis of the logic level of the second binary input signal R1.

The first transistor T2-1 of group T2 has its input and output terminals connected to, respectively, the second output line L-2 and the third output line L-3. The second transistor T2-2 of group T2 has its input and output terminals connected to, respectively, the first output line L-1 and the fifth output line L-5. The third transistor T2-3 of group T2 has its input and output terminals connected to, respectively, the first output line L-1 and the fourth output line L-4. The fourth transistor T2-4 of group T2 has its input and output terminals connected to, respectively, the second output line L-2 and the sixth output line L-6.

The second group of second-level transistors, jointly indicated by the reference letters Q2, comprises a first transistor Q2-1, a second transistor Q2-2, a third transistor Q2-3 and a fourth transistor Q2-4, each preferably realized as an NMOS transistor. These second level transistors Q2 of the second group have their respective gate terminals connected to the fourth control line LC2-2 in such a way as to assure that they will become activated/deactivated on the basis of the logic level of the second binary input signal R1.

The first transistor Q2-1 of group Q2 has its input and output terminals connected to, respectively, the first output line L-1 and the third output line L-3. The second transistor Q2-2 of group Q2 has its input and output terminals connected to, respectively, the second output line L-2 and the fifth output line L-5. The third transistor Q2-3 of group Q2 has its input and output terminals connected to, respectively, the first ground terminal GR and the fourth output line L-4. The fourth transistor Q2-4 of group Q2 has its input and output terminals connected to, respectively, the supply terminal Vdd and the sixth output line L-6.

On the basis of the logic level of the second binary signal R1 and therefore also on the basis of the logic level of its compliment, the second selection circuit SC-2 therefore renders possible selective connections of the third (L-3) and the fourth (L-4) output line to at least one of the reference terminals (Vdd, GR) and to at least one of the first (L-1) and second (L-2) output line to receive the high or low level logic signal.

In particular, the second selection circuit SC-2 makes possible a selective connection of the third output line (L-3) with the first output line (L-1) and the second output line (L-2). Furthermore, the fourth output line (L-4) can be selectively connected to one of the terminals Vdd and GR (the GR terminal, for example) and the first output line (L-1).

It should be noted that the second selection circuit SC-2 is such that when the transistors of the first group T2 are activated to conduct, the transistors of the second group Q2 are deactivated, and vice versa.

It should likewise be noted that the logic level of the signals present on the lines L-3 and L-4, and, therefore, the value assumed by the coded outputs Digit-1 and Digit-0 is a function not only of the second binary input signal R1, but also of the logic levels of the signals present on the output lines L-1 and L-2 of the first selection circuit SC-1.

The particular encoding circuit 1 shown in the figure is such as to operate in accordance with the following Code Table 1, which shows the relationship between the inputs R1 and R0 and the output codes Digit-1 and Digit-2:

Code Table 1

| R1 | R0 | Digit-1 | Digit-0 |
|----|----|---------|---------|
| 0  | 0  | 0       | 0       |
| 0  | 1  | 0       | 1       |
| 1  | 0  | 0       | 1       |
| 1  | 1  | 1       | 0       |

The least significant bit is present on output line Digit-0, while the most significant bit is made available on output line Digit-1.

It should be noted that the encoding defined by Code Table 1 provides the code word 00 as an output when none of the inputs is asserted (or activated), the code word 01 when only one input line (R0 or R1) is asserted (or activated) and the code word 10 when both the input lines (R0 and R1) are asserted (activated). In the present description the expression "asserted signal" is to be understood as meaning that the signal assumes the high logic level (bit 1). It is clear that the teachings of the present invention are applicable, albeit with modifications of the circuit of FIG. 1 that will be readily appreciated by those skilled in the art, also to the case where the expression "signal asserted" is understood as meaning that the signal assumes the low logic level.

For example, when the inputs are R0=0 and R1=0, only the transistors of the second group Q1 included in the first selection circuit SC-1 and the transistors of the second group Q2 in the first selection circuit SC-1 will be activated to conduct. In particular, the activated transistors include the transistor Q1-1, which provides a signal of low logic level on the first output line L-1. The transistor Q2-1, which has its input terminal connected to said line L-1, provides a signal of low logic level (bit 0) on the third output line L-3 and therefore also on the first code output line Digit-0. Furthermore, similarly activated to conduct is the transistor Q2-3, which has its input connected to the ground terminal GR and provides the low level signal on the fourth output line L-4 and therefore also on the second code output line.

Let us now consider an operating condition in which the two binary input signals assume the logic levels R0=1 and R1=0. The selection circuits SC-1 and SC-2 switch from the previous state to a new state in which there are established connections between their respective outputs different from those realized with the inputs R0=0 and R1=0.

With the first binary input R0=1 the transistors Q1 become deactivated, i.e. do not conduct, while the transistors T1 are activated and do conduct. In particular, transistor T1-1 is activated to have a high logic level signal present on the first output line L-1. Furthermore, transistor T1-2 is activated, so that a low level logic signal will be available on the second output line.

Through transistor Q2-1, which is connected to the first output line L-1, the second selection circuit SC-2 provides a signal of high logic level (bit 1) at the first code output Digit-0, while through transistor Q2-3 it provides a signal of low logic level (bit 0) to the second code output Digit-1.

In the case in which the binary inputs assume the levels R0=1 and R1=1, the transistors of groups T1 and T2 will be activated to conduct, while as compared with the previously described condition (R0=1 and R1=0) the transistors of group Q2 are now deactivated. In this case, therefore, the first selection circuit SC-1 provides a high-level logic signal on the first output line L-1 and a low-level logic signal on the second output line L-2. Through transistor T2-1, which is connected to the second output line L-2, the second selection circuit SC-2 provides a low level logic signal on the first code output Digit-0. Moreover, through the transistor T2-2, which is connected to the first output line, the second selection circuit SC-2 provides a low level logic signal on the second code output Digit-1.

It should be noted that it will be advantageous to have the circuit 1 of FIG. 1 operate in such a way that the output code, rather than being dependent on the particular combination of simultaneously asserted inputs, will depend only on the number of simultaneously asserted inputs.

Furthermore, the encoding circuit is independent of the order in which these inputs are asserted, i.e. it is an encoder without priorities. For example, starting from an initial input condition R0=0 and R1=0, the output code word will assume the value 10 (Digit-0=0 and Digit-1=1) independent of whether the high logic level (bit 1) was assumed by the input R0 or the input R1.

As can be deduced from Code Table 1, it should also be noted that the second selection circuit SC-2 permits the logic level of the second binary output signal Digit-1 to be switched only when the first binary input signal R0 is asserted (i.e. when, according to the example, it is equal to bit 1).

Furthermore, it should be noted that, unlike conventional encoding circuits, encoding circuit 1 in accordance with the invention is not limited to operating with merely one input line activated for each possible operating condition, but envisages the simultaneous activation of more than a single input line. In fact, the circuit of FIG. 1 has an operating condition in which two lines carrying binary input signals—in the example: the lines R0 and R1, both equal to bit 1—are simultaneously activated.

It should also be noted that the structure in accordance with the invention, which provides several interconnected selection circuits that cooperate in defining the output code, is considerably less complex than the structure of conventional encoding circuits having the form of combinatorial networks employing logic gates (OR, AND, etc.).

It should also be borne in mind that the circuit in accordance with the invention, which comprises a limited number of devices (such as MOS transistors) and possesses a modular structure, can be implemented as an integrated semiconductor circuit in a less complex and more compact manner, so that it will occupy less space than the conventional circuits employing logic gates.

Furthermore, the encoding in binary form provided by circuit 1 generates output signals that are suitable for subsequent digital processing.

It should also be noted that, as will be readily appreciated to those skilled in the art, that the present invention makes it possible to design and realize encoding circuits in which the number of binary inputs and code outputs are different from the number of inputs and outputs of circuit 1 of FIG. 1.

Figure 2:
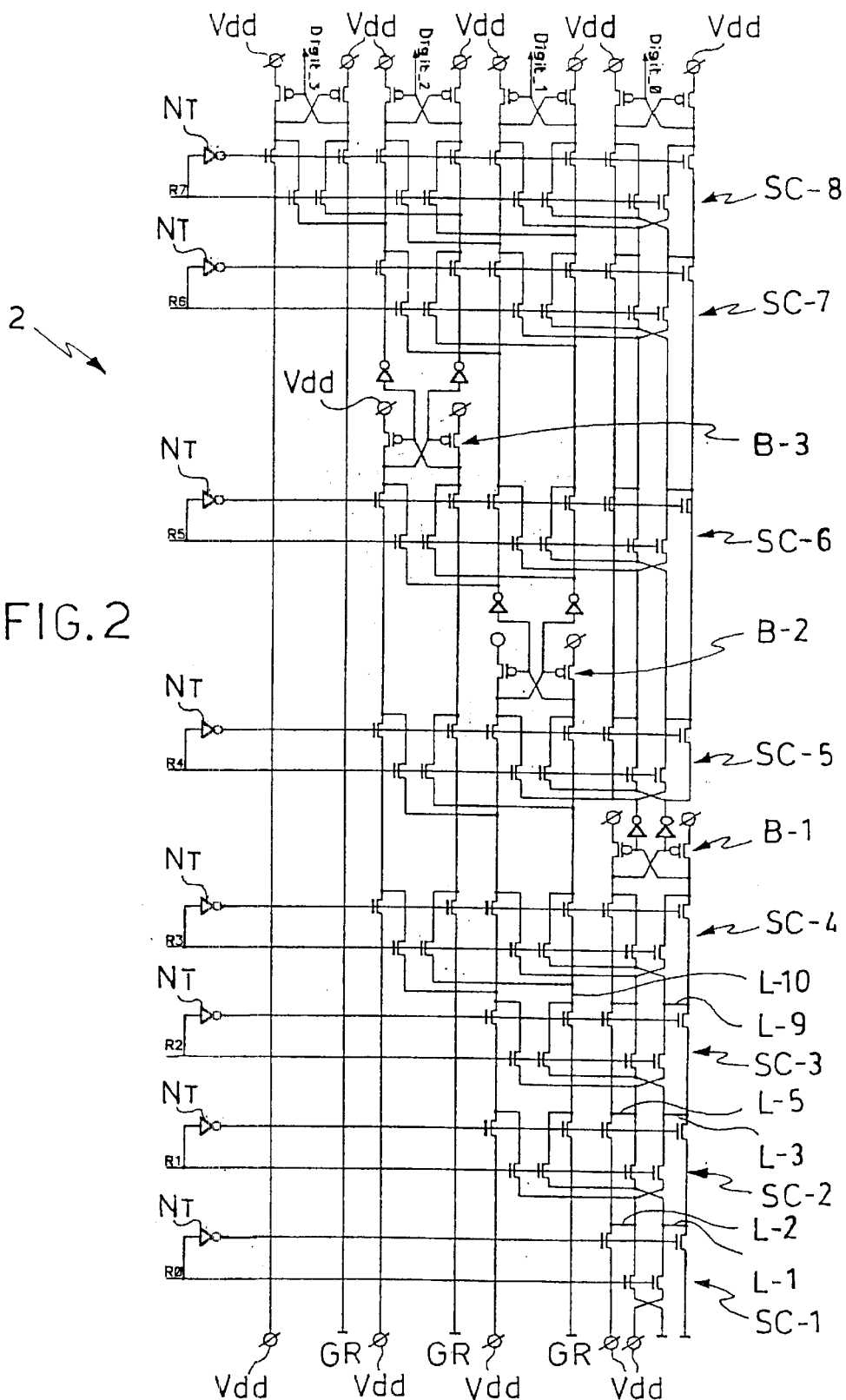
FIG. 2 is a schematic circuit diagram of a second encoding circuit realized in accordance with the invention.

In this connection and for completeness of description, FIG. 2 shows the schematic layout of an encoding circuit 2. Encoding circuit 2 makes it possible to convert eight binary input signals R0–R7 into an output code available on four code output lines Digit-0–Digit-3. The output Digit-0 makes available the least significant bit, while the most significant bit is made available by output Digit-3.

The encoding circuit of FIG. 2 comprises eight selection circuits SC-1–SC-8, each of which is such as to receive the respective binary input signal R0–R7. In the example of FIG. 2, the selection circuits SC-1 and SC-2 are identical with those having the same reference numbers and described in detail in connection with circuit 1 of FIG. 1.

The higher level circuits SC-3–SC-4 are similar to circuits SC-1 and SC-2 and do not require a further description herein, because their structure and their operating mode will be readily appreciated from the previous description and FIG. 2.

It should be noted that, given a generic selection circuit SC-i, the logic level of the outputs that contribute to the formation of the output code (and therefore also to all the code outputs Digit-0–Digit-1) is obtained not only on the basis of the selection state of circuit SC-i itself, but also on the basis of the selection state of the higher-level selection circuit SC-i-1. For example, the level of the code output line Digit-1 will depend on the logic level of the binary input signal R7 (and therefore on the selection state of circuit SC-8), but also on the logic levels of the output lines of the lower-level selection circuit SC-7).

What was previously said about selection circuit SC-1 and SC-2 of encoding circuit 1 is valid also—though subject to obvious adaptations—for any two consecutive circuits of encoding circuit 2 of FIG. 2. Let us consider selection circuit SC-2 and selection circuit SC-3 for example. In the case of circuit SC-2 the role performed by the supply terminal Vdd and the ground terminal GR can be performed by the outputs L-1 and L-2 of selection circuit SC-1. Selection circuit SC-2 is provided with the output L-3 and the output L-5, both previously introduced.

Therefore, as is made obvious by FIG. 2 and what has already been said, selection circuit SC-2 makes it possible for the output lines L-3 and L-5 to be connected selectively (i.e. on the basis of the logic level of the second binary input signal R1) to the output lines L-1 and L-2 to receive the corresponding high or low level logic signal. FIG. 2 shows output lines L-9 and L-10 of selection circuit SC-3. The signal present on output L-9 can contribute to the definition of the signal present on the code output Digit-1.

As will be apparent from FIG. 2 and what has already been said, selection circuit SC-3 makes it possible for output line L-3 and output line L-5 to be connected selectively (i.e. on the basis of the logic level of the third binary input signal R2) to at least one of the lines L-3 and L-5 to receive the corresponding high or low level logic signal.

Encoding circuit 2 of FIG. 2 may also advantageously comprise regeneration stages or buffers B1–B3 interposed between some of the selection circuits in order to simplify the signals. The buffers B1–B3 can be advantageously employed whenever this is required by the number of selection stages. According to the example, these buffers B1–B3 are of the conventional type and comprise P channel MOS biasing transistors and inverter circuits shown in the figure with NOT gates.

Figure 3:
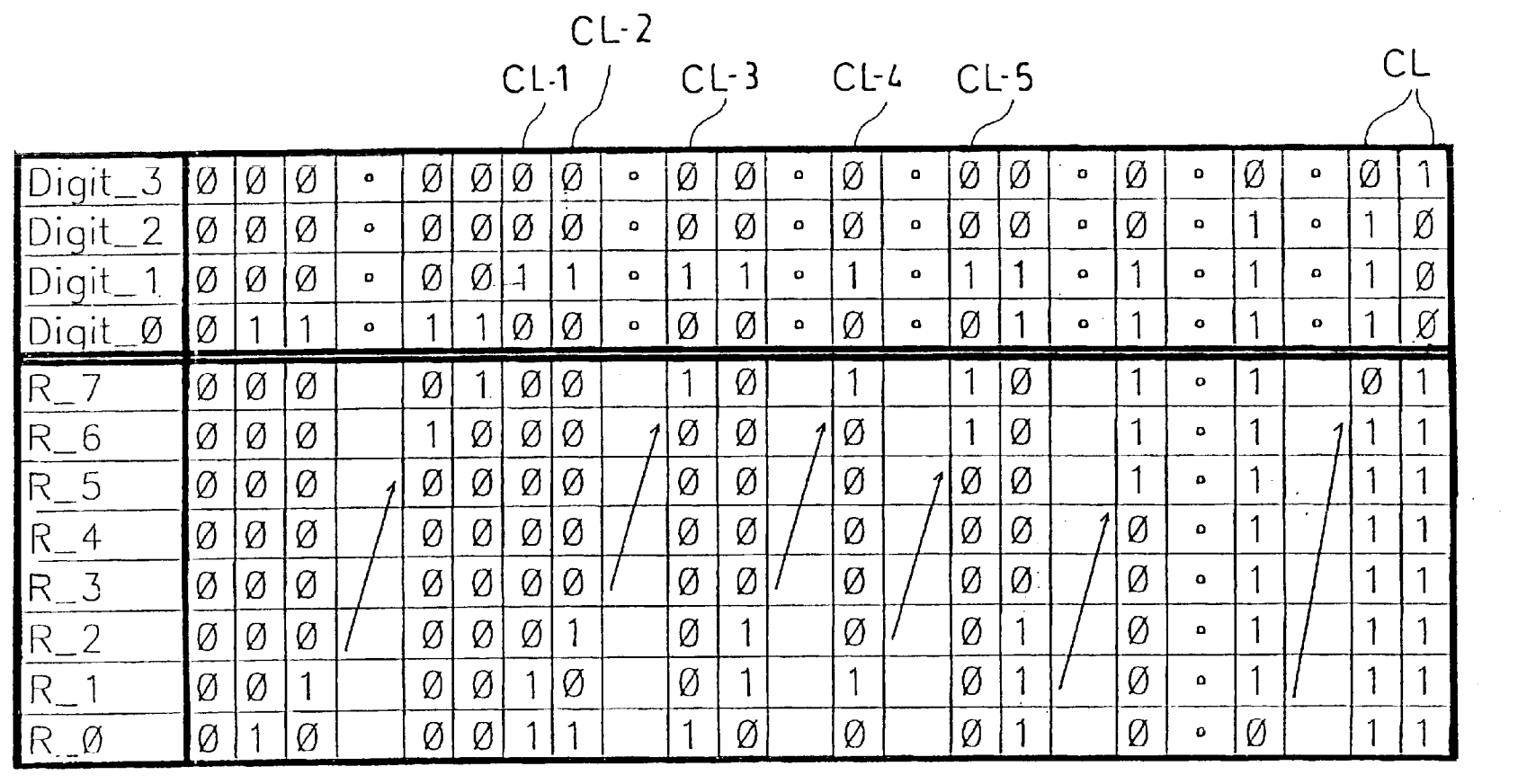

The code table for encoding circuit 2 is reproduced in FIG. 3. Each column of the upper par of the table of FIG. 3 shows the values assumed by the outputs Digit-0–Digit-3 when the inputs R0–R7 assume the values shown in the respective portions of the lower part of the table.

Encoding circuit 2 once again makes it possible for the output code to indicate the number (expressed in binary code) of the simultaneously asserted inputs. In other words, the encoding circuit 2, analogously to the encoding circuit 1, can act as a static counter. Advantageously, the encoding circuits 1 and 2 can act as counter circuit of events associated with the asserted binary input signals.

For the sake of simplicity of representation, the table of FIG. 3 does not show all the possible combinations for every number of simultaneously asserted inputs R0–R7, but only a few of them. In the case of two asserted inputs, for example, the table shows only the columns CL-1–CL-5, while the other columns relating to other possible combinations of the inputs have been omitted and are represented by dots and arrows.

It should be noted that the output code represents the number of simultaneously asserted inputs independently of the combination assumed by the asserted signals. For example, irrespective of whether the three inputs are R0=1, R1=1 and R2=1 or R5=0, R6=1 and R7=1, the output will always be the code word 0011 (Digit-3=0, Digit-2=0, Digit-1=1, Digit-0=1, which in binary code represents the number 3).

Furthermore, it should be noted that in analogy with circuit 1, circuit 2 operates with configurations that envisage several (more than just one) simultaneously asserted input signals.

An analysis of the table of FIG. 3 or the circuit of FIG. 2 brings out the fact that circuit 2 is such that that the assertion of an even number of input signals R0–R7 implies the non-assertion of the binary output signal corresponding to the least significant bit, i.e. in the example here considered Digit-0 assumes the low logic level (bit 0). Moreover, the assertion of an odd number of input signals R0–R7 implies the assertion of the binary output signal corresponding to the least significant bit, i.e. in the example here considered Digit-0 assumes the high logic level (bit 1).

With reference to the numerical indices of the figures and using K+1 to indicate the order of one of the selection circuits SC-1–SC-8, the respective input signal will be of order K. For example, the circuit SC-1 will receive the binary signal R7 as input.

Let us now consider the case in which an output of the selection circuit of order K+1 corresponds to a code output (Digit-N) that occupies a position of order N. The output of circuit SC-8, for example, corresponds to Digit-3 (K+1=8, K=7 and N=3).

It should be noted that in encoding circuit 2 the logic level of the output signal of position N depends on the logic level of a binary output signal of position N−1. According to the example here considered, Digit-3 depends on Digit-2 or, put in other terms, is a function of Digit-2.

This dependency is obtained by connecting the selection circuit of order K+1 to a selection circuit of a lower order (or level) intended to receive as input a binary input signal of order M. It should be noted that this connection between the selection circuits is effected for the first time upon the arrival of a particular input signal. In the example here considered this connection is provided for the first time between circuit SC-8 and the outputs of circuit SC-7 (which receives the signal R-6, M=6 as input) indicated by the circles in FIG. 2.

One may note that the order M of the binary input signal of the circuit with which this first connection is provided depends on (is bound up with) the position N of the binary output signal of the relationship: $M+1=2^N-1$ (where N>0). According to the example, indeed: N=3 and $M+1=2^N-1=8-1=7$, and therefore M=6, we are here concerned with the input signal R6.

Furthermore, analyzing the table of FIG. 3 and the circuit of FIG. 2, one finds that the switching of the logic level of the output signal of position N can take place only when the overall number of asserted binary input signals is equal to $2^N$. In fact, when N=3, $2^N=8$ and, as confirmed by what is shown in the columns CL of FIG. 3, Digit-3 is switched from 0 to 1 only when all the eight inputs have been asserted (from bit 0 to bit 1). In addition, it is observed that the encoding circuit 2 is such that when at least one of the input signals R0–R7 changes, a switching of the logic level of the least significant bit (output line Digit-0) occurs.

It is also noticed that, as it is clear from FIG. 2, the number of the circuit blocks connecting the ground and supply terminal, Vdd and GND, to the output digit lines is equal to the number of said digit lines (Digit-0–Digit-3). Furthermore, encoding circuit 2 has all the advantages in terms of compactness previously mentioned in connection with encoding circuit 1.

The encoding circuit realized in accordance with the teachings of the present invention has particularly advantageous applications. As already mentioned, circuit 1 of FIG. 1 can be employed to generate an output code that represents the number of simultaneously activated binary input signals (R0, R1), in particular—according to the example consider—signals of the high logic level. These binary input signals R0 and R1 may represent an event that it is desired to monitor.

For example, each of the binary input signals R0 and R1 could be obtained by comparing (greater/smaller) a number Ai stored in an $i^{th}$ register (not shown in the figure) and a predetermined reference number F. For example, the binary input signal will assume the high logic level when the number Ai stored in a corresponding $i^{th}$ register is greater (smaller) than a given predetermined number F. Encoding circuit 1 could therefore indicate by a binary number how many registers store a respective number Ai greater than the predetermined number F.

According to another application, the encoding circuit of the invention can be employed in the ambit of erasing or programming such matrices of non-volatile memory cells as flash memories or MTP (Multiple Time Programmable) memories. For example, as is well known, the "erase" operation envisages the application of erasure pulses to a particular sector of cells of the matrix or to the entire matrix until complete erasure has been attained.

It may happen that the greater part of the cells will have been erased after a reasonable number of pulses and only a limited number of these cells will experience difficulty in becoming erased and, consequently, require a larger number of pulses. It may be convenient to stop the erasing operation, foregoing the erasure of this limited number of cells and their further use. In that way one avoids subjecting the entire matrix to stress induced by the erasure pulses applied to the entire matrix but aiming only at erasing this limited number of cells. The subsequent useless application of pulses, even though it may lead to the success of the erasure operation, could overerase some of the cells, with consequent limitation of the useful life of the memory matrix.

As is known, a programming operation likewise includes a succession of pulses applied to the cells to impose a fine level of conductivity. It may be convenient to stop the application of the programming pulses after an appropriate number of attempts if only a limited number of cells needs a larger number of pulses than the others. In that case the cells concerned will be substituted.

In the two cases that have just been described by way of example it will therefore be useful to monitor the number of applied (programming or erasing) pulses to be able to recognize the memory cells that have problems in executing the specific operation.

For example, an appropriate set of registers associated with the memory cells could store the number of pulses applied to the cells for executing the specific operation and it may be appropriate to know the number of memory cells that after a predetermined number of attempts do not permit the specific operation to be successfully completed. These monitoring functions can be performed by appropriately employing the encoding circuit in accordance with the invention.

When a person skilled in the art has to meet contingent and specific needs, he will be able to introduce numerous modifications and variants into the encoding circuits in accordance with the present invention within the scope of the claims attached hereto.

That which is claimed is:

1. A binary encoding circuit for converting a plurality of binary input signals, including at least first and second input signals, into an output code including at least first and second binary output signals, the circuit comprising:
   at least two logic value supply terminals to render available a signal of a high logic level and a signal of a low logic level;
   at least one first selection circuit comprising first and second output lines capable of being selectively connected to said logic value supply terminals based upon a logic level of the first binary input signal; and
   at least one second selection circuit comprising third and fourth output lines capable of being selectively connected to at least one of said first and second output lines based upon a logic level of the second binary input signal;
   said first and second binary output signals being provided by signals available on the third and fourth output lines.

2. A circuit in accordance with claim 1 wherein the third output line of said at least one second selection circuit is selectively connectable to the first and second output lines.

3. A circuit in accordance with claim 1 wherein the at least one first and second binary input signals are simultaneously assertable.

4. A circuit in accordance with claim 3 wherein said at least first and second binary output signals represent a number expressed in binary code of simultaneously asserted binary input signals.

5. A circuit in accordance with claim 4 wherein logic levels of said binary output signals are independent of an order of assertion of said binary input signals.

6. A circuit in accordance with claim 5 wherein when at least one of the binary input signals changes, a switching of a logic level of at least significant bit occurs.

7. A circuit in accordance with claim 4 wherein a logic level of said output signals is independent of an order of assertion of said binary input signals and depends only on a number of asserted binary input signals.

8. A circuit in accordance with claim 4 wherein said circuit acts as static counter of said simultaneously asserted binary input signals.

9. A circuit in accordance with claim 8 wherein said circuit acts as static counter of events associated with said asserted binary input signals.

10. A circuit in accordance with claim 1 wherein said at least one first and second selection circuits each comprises a respective group of transistors respectively activatable/deactivatable based upon a logic level of said first and second binary input signals.

11. A circuit in accordance with claim 10 wherein said at least one first and second selection circuits each comprises first and second groups of MOS transistors connected to said first output line or said second output lines, the first group of MOS transistors being activated to conduct when the second group of transistors is deactivated.

12. A circuit in accordance with claim 11 wherein said first group of MOS transistors of the first selection circuit comprises:

first first-level transistors having respective gate terminals connected to a first control line carrying the first binary input signal and respective input terminals connected to one of said logic value supply terminals, said first first-level transistors having respective output terminals connected to the first output line or the second output line.

13. A circuit in accordance with claim 11 wherein said second group of MOS transistors of the second selection circuit comprises second second-level transistors having respective gate terminals connected to a fourth control line carrying a second complimentary signal of the second binary input signal, said second second-level transistors comprising:

at least one transistor having an input terminal connected to said first output line and an output terminal connected to said third output line; and at least one further transistor having an input terminal connected to one of said logic value supply terminals and an output terminal connected to said fourth output line.

14. A circuit in accordance with claim 11 wherein said second group of MOS transistors of the first selection circuit comprises:

second first-level transistors having respective gate terminals connected to a second control line carrying a first complimentary signal of the first binary input signal and respective input terminals connected to one of said logic value supply terminals, said second first-level transistors having respective output terminals connected to the first output line or the second output line; and first second-level transistors having respective gate terminals connected to a third control line carrying the second binary input signal and respective input terminals connected to said first output line or said second output line to receive the high or low level logic signal, at least one subgroup of said first second-level transistors having respective output terminals connected to the third output line or the fourth output line.

15. A circuit in accordance with claim 10 wherein said group of transistors that are activatable/deactivatable of said at least first and second selection circuits comprise N channel MOS transistors.

16. A circuit in accordance with claim 15 further comprising P channel MOS transistors.

17. A circuit in accordance with claim 1 wherein said at least one second selection circuit also permits the fourth output line to be selectively connected to said logic value supply terminals.

18. A circuit in accordance with claim 1 wherein said first selection circuit, based upon switching of a logic level of the first binary input signal, causes switching of a logic level of signals present on the first and second output lines.

19. A circuit in accordance with claim 1 wherein said second selection circuit, based upon switching of a logic level of the second binary input signal, causes switching of a logic level of signals present on the third and the fourth output lines.

20. A circuit in accordance with claim 1 wherein said first binary output signal coincides with a least significant bit of the output code, said circuit being such that the assertion of an even number of said at least first and second input signals will cause a de-assertion of the first binary output signal and such that the assertion of an odd number of said at least first and second input signals will cause the assertion of the first binary output signal.

21. A circuit in accordance with claim 20 wherein said second binary output signal coincides with a more significant bit than said first binary output signal; and wherein said second selection circuit makes possible for a logic level of the second binary output signal to be switched only when said first binary input signal is asserted.

22. A circuit in accordance with claim 1 further comprising at least one further selection circuit of order K+1 commanded by a binary input signal of order K to receive signals of high or low logic level; and wherein said further selection circuit furnishes an output signal having a position N in the binary output code.

23. A circuit in accordance with claim 22 wherein said circuit is such that a logic level of said output signal of position N is dependent on the logic level of a binary output signal of position N in the binary code; and wherein the dependency is obtained by connecting said further selection circuit to a selection circuit of an order intended to receive as an input a binary input signal of order M.

24. A circuit in accordance with claim 23 wherein switching of a logic level of the output signal of position N can take place only when the overall number of asserted input signals is equal to $2^N$.

25. A circuit in accordance with claim 23 the wherein the order M of said binary input signal of order M is related to the position N of the binary output signal of position N based upon a relationship: $M-1=2^N-1$.

26. A circuit in accordance with claim 1 further comprising at least one regeneration stage interposed between said first and second selection circuits.

27. A binary encoding circuit for converting a plurality of binary input signals, including at least first and second input signals, into an output code including at least first and second binary output signals, the circuit comprising:

at least two logic value supply terminals to render available a signal of a high logic level and a signal of a low logic level;

at least one first selection circuit comprising first and second output lines capable of being selectively connected to said logic value supply terminals based upon a logic level of the first input signal; and at least one second selection circuit comprising third and fourth output lines capable of being selectively connected to at least one of said first and second output lines based upon a logic level of the second binary input signal;

said first and second binary output signals being provided by signals available on the third and fourth output lines;

said at least first and second binary output signals representing a number expressed in binary code of simultaneously asserted binary input signals, and logic levels of said binary output signals being independent of an order of assertion of said binary input signals.

28. A circuit in accordance with claim 27 wherein said at least one first and second selection circuits each comprises a respective group of transistors respectively activatable/deactivatable based upon a logic level of said first and second binary input signals.

29. A circuit in accordance with claim 28 wherein said at least one first and second selection circuits each comprises a first and second group of MOS transistors connected to said first output line or said second output line, the first group of MOS transistors being activated to conduct when the second group of transistors is deactivated.

30. A circuit in accordance with claim 27 wherein said circuit acts as a static counter of said simultaneously asserted binary input signals.

31. A circuit in accordance with claim 30 wherein said circuit acts as a static counter of events associated with said asserted binary input signals.

32. A circuit in accordance with claim 27 further comprising at least one regeneration stage interposed between said first and second selection circuits.

33. A method for converting a plurality of binary input signals, including at least first and second input signals, into an output code including at least first and second binary output signals, the method comprising:

rendering available a signal of a high logic level and a signal of a low logic level on at least first and second logic value supply terminals;

providing at least one first selection circuit comprising first and second output lines capable of being selectively connected to the logic value supply terminals based upon a logic level of the first input signal; and providing at least one second selection circuit comprising third and fourth output lines capable of being selectively connected to at least one of the first and second output lines based upon a logic level of the second binary input signal;

generating first and second binary output signals by signals available on the third and fourth output lines.

34. A method according to claim 33 wherein the at least first and second binary output signals represent a number expressed in binary code of simultaneously asserted binary input signals, and wherein logic levels of the binary output signals are independent of an order of assertion of the binary input signals.

* * * * *

UNITED STATES PATENT AND TRADEMARK OFFICE
CERTIFICATE OF CORRECTION

PATENT NO.    : 6,696,990 B2                                              Page 1 of 1
DATED         : February 24, 2004
INVENTOR(S)   : Luigi Pascucci It is certified that error appears in the above-identified patent and that said Letters Patent is hereby corrected as shown below:

<u>Title page,</u>
Insert Item:  [30]         Foreign Application Priority Data

December 24, 2001        (IT) .......MI2001 A 002795 --

Signed and Sealed this

First Day of June, 2004

JON W. DUDAS
*Acting Director of the United States Patent and Trademark Office*